US009635509B2

(12) United States Patent
Krattiger et al.

(10) Patent No.: US 9,635,509 B2
(45) Date of Patent: *Apr. 25, 2017

(54) WIRELESS ARRAY DEVICE AND SYSTEM FOR MANAGING WIRELESS ARRAYS HAVING MAGNETOMETERS

(71) Applicant: Xirrus, Inc., Thousand Oaks, CA (US)

(72) Inventors: Steven Krattiger, Northridge, CA (US); Brian Mason, Sherman Oaks, CA (US)

(73) Assignee: Xirrus, Inc., Thousand Oaks, CA (US)

( * ) Notice: Subject to any disclaimer, the term of this patent is extended or adjusted under 35 U.S.C. 154(b) by 85 days.

This patent is subject to a terminal disclaimer.

(21) Appl. No.: 14/245,922

(22) Filed: Apr. 4, 2014

(65) Prior Publication Data

US 2014/0301227 A1    Oct. 9, 2014

Related U.S. Application Data

(63) Continuation of application No. 13/101,726, filed on May 5, 2011, now Pat. No. 8,694,010, which is a continuation-in-part of application No. 13/094,049, filed on Apr. 26, 2011, now Pat. No. 9,392,573.

(51) Int. Cl.
| H04W 4/02 | (2009.01) |
| H04W 72/04 | (2009.01) |
| H01Q 1/00 | (2006.01) |
| H01Q 9/28 | (2006.01) |
| H01Q 19/10 | (2006.01) |
| H01Q 21/20 | (2006.01) |
| G01R 33/00 | (2006.01) |
| H04W 64/00 | (2009.01) |

(Continued)

(52) U.S. Cl.
CPC ........ *H04W 4/026* (2013.01); *G01R 33/0094* (2013.01); *H01Q 1/007* (2013.01); *H01Q 9/285* (2013.01); *H01Q 19/106* (2013.01); *H01Q 21/205* (2013.01); *H04W 4/023* (2013.01); *H04W 64/00* (2013.01); *H04W 72/0453* (2013.01); *H04W 88/06* (2013.01); *H04W 16/28* (2013.01); *H04W 72/046* (2013.01)

(58) Field of Classification Search
None
See application file for complete search history.

(56) References Cited

U.S. PATENT DOCUMENTS

| 7,565,169 B1 * | 7/2009 | Theobold | H04W 64/006 342/147 |
| 2003/0141973 A1 * | 7/2003 | Yeh | G08G 1/005 340/539.13 |

(Continued)

Primary Examiner — Robert C Scheibel
(74) Attorney, Agent, or Firm — SoCal IP Law Group LLP; John E. Gunther; Steven C. Sereboff

(57) ABSTRACT

A wireless array for providing access to a network is provided. The wireless array includes at least two transceivers in signal communication with a client. A magnetometer of the wireless array provides orientation information relating to an orientation of the wireless array relative to a magnetic field. A controller of the wireless array is in signal communication with the transceivers and the magnetometer. The controller manages the communications exchanged via the transceivers and receives the orientation information provided by the magnetometer.

12 Claims, 7 Drawing Sheets

(51) Int. Cl.
    *H04W 88/06*     (2009.01)
    *H04W 16/28*     (2009.01)

(56) References Cited

U.S. PATENT DOCUMENTS

| | | | | |
|---|---|---|---|---|
| 2004/0203921 | A1* | 10/2004 | Bromhead | H04W 64/00 |
| | | | | 455/456.1 |
| 2005/0265288 | A1* | 12/2005 | Liu | H04W 72/082 |
| | | | | 370/332 |
| 2006/0012521 | A1* | 1/2006 | Small | G01S 5/0215 |
| | | | | 342/386 |
| 2006/0128354 | A1* | 6/2006 | Carle | A62B 33/00 |
| | | | | 455/404.1 |
| 2009/0190914 | A1* | 7/2009 | Scott | G03B 17/24 |
| | | | | 396/311 |
| 2009/0319348 | A1* | 12/2009 | Khosravy | G01C 21/20 |
| | | | | 705/14.1 |
| 2011/0025494 | A1* | 2/2011 | Adcook | G01S 5/0284 |
| | | | | 340/539.13 |
| 2012/0088452 | A1* | 4/2012 | Jorgensen | G01S 3/40 |
| | | | | 455/41.3 |
| 2012/0270564 | A1* | 10/2012 | Gum | G01C 21/206 |
| | | | | 455/456.3 |
| 2014/0188638 | A1* | 7/2014 | Jones | H04M 1/72569 |
| | | | | 705/16 |

* cited by examiner

WIRELESS ARRAY DEVICE AND SYSTEM FOR MANAGING WIRELESS ARRAYS HAVING MAGNETOMETERS

RELATED APPLICATION INFORMATION

This patent is a continuation of application Ser. No. 13/101,726, filed on May 5, 2011, now Pat. No. 8,694,010, which is a continuation-in-part of application Ser. No. 13/094,049, filed on Apr. 26, 2011, now Pat. No. 9,392,573.

BACKGROUND

1. Field of the Invention

This invention relates to wireless communication devices and more particularly to wireless communication devices that provide information relating to the alignment and orientation of the device.

2. Description of Related Art

The use of wireless communication devices for data networking continues to grow at a rapid pace. Data networks that use "WiFi" ("Wireless Fidelity"), also known as "Wi-Fi," are relatively easy to install, convenient to use, and supported by the IEEE 802.11 standard. WiFi data networks also provide performance that makes WiFi a suitable alternative to a wired data network for many business and home users.

WiFi networks operate by employing wireless access points that provide users, having wireless (or "client") devices in proximity to the access point, with access to varying types of data networks such as, for example, an Ethernet network or the Internet. The wireless access points include a radio that operates according to the standards specified in different sections of the IEEE 802.11 specification. Generally, radios in the access points communicate with client devices by utilizing omni-directional antennas that allow the radios to communicate with client devices in any direction. The access points are then connected (by hardwired connections) to a data network system that completes the access of the client device to the data network. The different standards under IEEE 802.11 define channels that wireless devices, or clients, use when communicating with an access point.

High-end wireless access devices recently developed include multiple radios to improve bandwidth, user density, signal strength, coverage area, signal management, and load balancing. These high-end wireless access devices (wireless arrays) may operate in the WiFi frequency bands. For example, under the IEEE 802.11 standard, the wireless access devices may operate in and around the 2.4 GHz, 3.6 GHz, and 5 GHz frequency bands, which provide various channels (i.e., frequencies) in which WiFi communications may be transmitted. Because these high-end wireless access devices include multiple radios, each radio may operate in a different channel (i.e., at a different frequency) to avoid any interference that may result from frequency overlap. Overlapping frequencies may degrade performance and result in poor wireless communications due to, for example, low throughput. Thus, having each radio of a wireless array operate at a different frequency helps to reduce frequency overlap and interference.

However, overlapping frequencies may also result when multiple wireless access devices are installed in various locations around the campuses of businesses, hospitals, schools, and the like to provide campus-wide wireless coverage. For example, a group of wireless access devices may be installed such that radios operating at the same frequency are pointed toward each other. If the antenna patterns of the radios operating at the same frequency overlap, interference and performance degradation may result as discussed above. Therefore, frequency planning helps to avoid frequency overlap when installing and configuring the multiple wireless access devices. Frequency planning may depend upon knowledge of how the wireless access devices are oriented. However, existing methods to acquire orientation information may rely on visual inspection and estimation. These conventional methods may be prone to error and lead to misleading or inaccurate information regarding the orientation of a wireless access device.

The wireless access devices may also be used to locate clients throughout the campus wireless network. Based on the wireless access device a client is in signal communication with, the location of the client can be approximated. The ability to locate a client may be useful, for example, to recover lost or stolen wireless devices. The ability to locate a client may also be useful when clients are fixed to individual containers at storage sites enabling the location of the containers at the storage site to be tracked. However, accurately determining the location of a client may also depend upon having accurate information regarding how one or more of the wireless access device are oriented.

Therefore, a need exists for a wireless access device that provides accurate orientation information, which may be used during frequency planning and to improve methods for identifying the location of a client transmitting to the wireless access device.

SUMMARY

A wireless array that provides access to a network is shown. The wireless array includes at least two transceivers in signal communication with one or more clients. A magnetometer of the wireless array provides orientation information relating to the orientation of the wireless array relative to a magnetic field. A controller of the wireless array is in signal communication with the transceivers and the magnetometer. The controller manages the communications exchanged via the transceivers and receives the orientation information provided by the magnetometer.

A system that manages wireless arrays deployed in a network is also provided. The system includes at least two wireless arrays deployed in the network. At least one of the wireless arrays includes at least two transceivers in signal communication with a client, a magnetometer, and a controller in signal communication with the transceivers and the magnetometer. The magnetometer provides orientation information relating to the orientation of the wireless array relative to a magnetic field. The controller manages the communications exchanged via the transceivers and receives the orientation information provided by the magnetometer. A wireless array management system is in signal communication with the wireless arrays deployed in the network. The wireless array management system includes one or more modules for managing the wireless arrays.

DETAILED DESCRIPTION

Figure 1:
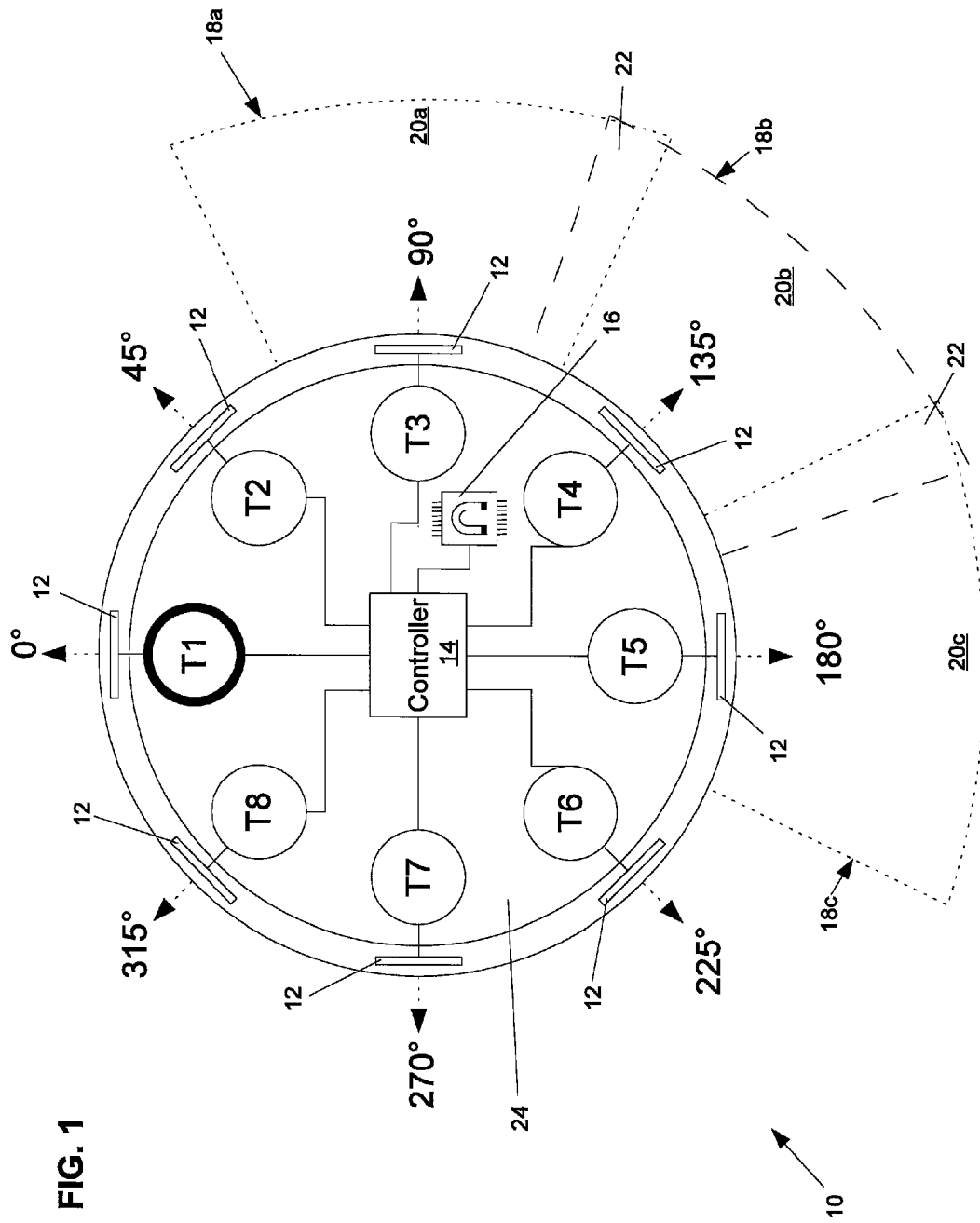
FIG. 1 is a schematic view of an example of an implementation of a wireless access device that provides orientation information.

A wireless array device and system for managing wireless arrays having magnetometers is described in this application. Referring to FIG. 1, an example wireless access device 10 that provides orientation information is shown. The wireless access device 10 includes multiple transceivers T1-T8, which may be used to provide a client with wireless access to a network by exchanging wireless communications with the client. The wireless access device may be described as being in signal communication with the client, in particular in signal communication with the client.

The term "in signal communication" as used in the application means that two or more devices and/or components are capable of communicating with each other via signals that travel over some type of signal path. Signal communication may be wired or wireless. The signals may be communication, power, data, or energy signals which may communicate information, power, and/or energy from a first device and/or component to a second device and/or component along a signal path between the first device and/or component and second device and/or component. The signal paths may include physical, electrical, magnetic, electromagnetic, optical, wired, and/or wireless connections between the first device and/or component and second device and/or component. The signal paths may also include additional devices and/or components between the first device and/or component and second device and/or component.

Wireless access devices having multiple transceivers may be referred to as wireless arrays. Additional information about wireless arrays may be found, for example, in U.S. Patent Application Publication No. US 2008/0267151 A1 (U.S. patent application Ser. No. 11/816,064), entitled "Wireless Local Area Network Antenna Array," filed Apr. 3, 2008 and in U.S. Patent Application Publication No. US 2009/0022114 A1 (U.S. patent application Ser. No. 11/816, 003), entitled "Access Point in a Wireless LAN," filed Sep. 22, 2006. These patent applications are assigned to the same assignee, Xirrus, Inc., as the present application. Further, the entire disclosure of these patent application publications is hereby incorporated by reference.

The wireless array 10 of FIG. 1 includes multiple transceivers T1-T8 (radios, for example) each in signal communication with a corresponding antenna 12 for wireless communication. The transceivers T1-T8 are also in signal communication with a controller 14, which manages the communications between the transceivers T1-T8 and clients in signal communication with the wireless array. A client in signal communication with a wireless array refers to a client that exchanges communication signals with the wireless array or simply transmits communication signals to the wireless array. A device in signal communication with a wireless array transmits communication signals within range of a wireless array such that the wireless array can hear (e.g., receive the broadcast from) the wireless device. A device that is in signal communication with a wireless array is connected to the wireless array if the wireless device has been authenticated via, for example, a password. A wireless device may be in signal communication with a wireless array but not connected to the wireless array if the wireless device has not been authenticated. A wireless device in signal communication with but not connected to a wireless array may be referred to as rogue device. Rogue devices may include clients as well as other wireless access points.

The wireless array 10 shown in FIG. 1 also includes a magnetometer 16. As explained further below with reference to FIG. 2, the magnetometer 16 is used to determine the spatial orientation of the wireless array 10 relative to a magnetic field. Those skilled in the art will understand that the schematic representation of the wireless array 10 in FIG. 1 is by way of example only and may include additional or alternative components.

The antennas 12 of the wireless array 10 shown in FIG. 1 are distributed around the circumference of the wireless array. The antennas 12 may be directional antennas configured to exchange wireless communications, for example, in a radial direction from the center of the wireless array 10. Each antenna 12 in the example shown is in signal communication with a corresponding transceiver T1-T8 that exchanges wireless communications with a client via the antennas. Additionally, each antenna 12 of the wireless array 10 in FIG. 1 may broadcast a directional antenna pattern 18a-c that covers a portion of the circular area surrounding the wireless array. Each portion covered by an antenna pattern of the wireless array 10 may be referred to as a sector. By way of example in FIG. 1, directional antenna patterns 18a-c are shown being respectively broadcast from transceivers T3-T5 in the wireless array 10 resulting in three sectors 20a-c. As seen in FIG. 1, the antenna pattern 18b overlaps the antenna patterns 18a and 18c resulting in overlapping portions 22 of the antenna patterns. The total area covered by the antenna sectors of the wireless array 10 in FIG. 1 defines, for example, a 360° area of coverage. The wireless array 10 seen in FIG. 1 includes eight antennas 12 resulting in eight potential sectors. Those skilled in the art will recognize that any number of antennas may be used. For example, wireless arrays may alternatively include 4, 12, or 16 antennas, which respectively correspond to 4, 12, and 16 sectors.

Further, the eight antennas 12 and transceivers T1-T8 of the wireless array 10 in FIG. 1 are each positioned at 45° intervals around the circumference of the wireless array. For example, the position of transceiver T1 in the wireless array 10 may be described as being 0° from the top of the wireless array; transceiver T2 is 45° clockwise (CW) from the top of the wireless array; transceiver T3 is 90° CW; transceiver T4 is 135° CW; and so forth for transceivers T5-T8. Those skilled in the art will also recognize that wireless arrays may employ alternative shapes and include alternative arrangements of the transceivers and antennas. Further, those skilled in the art will recognize that the position of the transceivers in the wireless array may be described using alternative conventions. For example, transceiver T3 may be described as being positioned 270° counterclockwise (CCW) from the top of the array (versus 90° CW). Likewise, transceiver T8 may be described as 45° CCW from the top of the array (versus 315° CW). Additional or alternative conventions to describe the position of the transceivers in the wireless array may be selectively employed.

Further, any one of the transceivers T1-T8 may be defined as a monitor radio, which may be configured to listen to one or more of the standard wireless frequencies. In the example shown, transceiver T1 has been designated as the monitor radio as indicated by the relatively thicker line border. The monitor radio may be used to assist in one or more of the following: station localization, station real-time tracking, proactive channel monitoring, and rogue localization. Station localization refers to determining the position and/or direction of a client in signal communication with a wireless array relative to the wireless array. Station real-time tracking refers to tracking the geospatial location of a client in signal communication with one or more wireless arrays as the client changes its location relative to the wireless arrays. Proactive channel monitoring refers to, for example, using the monitor radio to scan for interference or rogue devices. Rogue localization refers to determining the position and/or location of a rogue device (e.g., a rogue client or a rogue access point) in signal communication with the wireless array relative to the wireless array. These tasks will be discussed below in further detail.

The transceivers T1-T8 are also in signal communication with the controller 14, which manages communications between the transceivers and a client in signal communication with the wireless array. The controller 14 may include a processor (not shown) that provides computing resources for the wireless array 10. The processor may be any form of microprocessor capable of executing instructions or code. The wireless array 10 connects to a network through one or more wired network uplinks as explained further below. The controller 14 manages the communications over the network uplinks to and from the network.

The magnetometer 16 of the wireless array 10 provides orientation information relating to the orientation of the wireless array and may be any form of sensor capable of determining the spatial orientation of the wireless array relative to a magnetic field. For example, the magnetometer 16 may be an integrated circuit secured to the motherboard 24 of the wireless array 10 and in signal communication with the controller 14 as seen in FIG. 1. A suitable magnetometer may be available from Honeywell Aerospace in Plymouth, Minn. as model designation HMC5883L. A suitable magnetometer may also be available from Freescale Semiconductor, Inc. in Austin, Tex. as model designation MAG3110.

Figure 2:
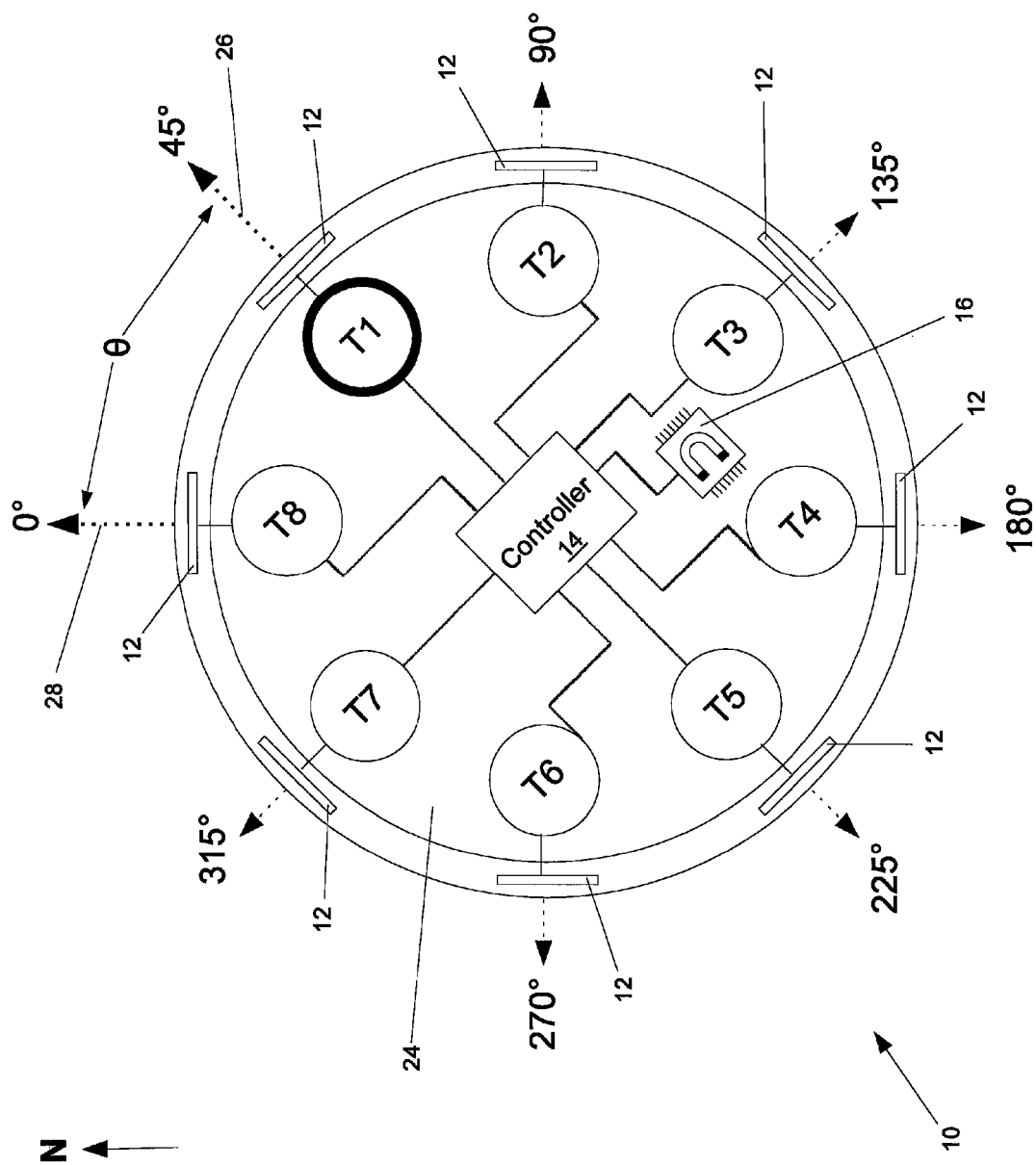
FIG. 2 is a schematic view of the example implementation of the wireless access device of FIG. 1 oriented relative to a reference bearing.

Referring now to FIG. 2, the example wireless array 10 of FIG. 1 is shown, which illustrates the operation of the magnetometer 16. As mentioned above, the arrangement of transceivers T1-T8 in the wireless array 10 may be known (e.g., at 45° intervals). However, the wireless array 10 itself may be installed such that the wireless array is oriented in a different direction relative to another wireless array. For example, a first wireless array may be installed oriented due west, while a second wireless array may be installed oriented due east. In FIG. 2, the wireless array 10 is oriented in the north-east direction. Accordingly, the spatial orientation of the individual transceivers T1-T8 may be indeterminable without knowledge of the spatial orientation of the wireless array 10 itself. The magnetometer 16 of the wireless array 10 provides the orientation information relating to the spatial orientation of the wireless array, which may be used to determine the spatial orientation of the transceivers T1-T8 of the wireless array.

The magnetometer 16, in the example shown, may measure the direction of a nearby magnetic field. Thus, the magnetometer 16 may determine the spatial orientation of the wireless array relative to the magnetic field. In the example wireless array 10 of FIG. 2, the magnetometer 16 uses the natural magnetic field of the Earth to determine the orientation of the wireless array relative to the surface of the Earth (i.e., the geospatial orientation of the wireless array).

The spatial orientation of the wireless array 10 in the example shown is provided as an azimuth θ value. The azimuth θ is the angular measurement between a bearing 26 and a reference bearing 28. Wireless arrays that determine geospatial orientation based on the natural magnetic field of the Earth may use magnetic north as the reference bearing 28 as shown by way of example in FIG. 2. Additionally, the orientation of the wireless array 10 may be given by the bearing 26 at the top of the wireless array 10, which is shown by way of example in FIG. 2 as the bearing near transceiver T1 at the top of the wireless array. Accordingly, the azimuth θ is the angle between the bearing 26 of the wireless array 10 and the reference bearing 28 of magnetic north. In the example shown, the wireless array 10 is oriented in the north-west direction, i.e., 45° CW from the reference bearing 28 of magnetic north. Thus, the azimuth θ of the wireless array may be provided as 45°. Again, those skilled in the art will recognize that the azimuth θ may also be described in a CCW direction.

As can be seen from the wireless array 10 in the example shown, the azimuth θ may be used to determine the spatial orientation of each transceiver T1-T8 of the wireless array relative to the reference bearing 28 of magnetic north. As mentioned above, the transceivers T1-T8 of the wireless array 10 in FIG. 2 are spaced apart in 45° increments around the circumference of the wireless array. Because the wireless array 10 itself has a geospatial orientation of 45°, each transceiver T1-T8 in the wireless array is offset by 45°. Thus, the geospatial orientation of each transceiver T1-T8 may be calculated by adding the azimuth θ to the known position of each transceiver in the wireless array 10.

For example, transceiver T2 in FIG. 2 is positioned at the top-right of the wireless array 10 and is positioned 45° CW from the top of the wireless array. When the wireless array 10 is oriented 45° CW from the reference bearing 28 of magnetic north, as shown in FIG. 2, transceiver T2 has a geospatial orientation of 90° CW, which may be determined by adding the azimuth θ (45°) to the known position of transceiver T2 (45°) in the wireless array 10. As another example, transceiver T5 is positioned at the bottom of the array 10 (180° CW from the top of the array). Where the azimuth θ of the wireless array 10 is 45° CW, as seen in FIG. 2, transceiver T5 has a geospatial orientation of 225° CW as shown. Thus, the magnetometer 16 in the wireless array 10 provides the geospatial orientation of the wireless array, which may be used to also determine the geospatial orientation of each transceiver T1-T8 in the wireless array. As discussed further below, the geospatial orientation of the transceivers T1-T8 in the wireless array 10 may be used to determine the angular direction of a client in signal communication with the wireless array relative to the wireless array (i.e., station localization).

Figure 3:
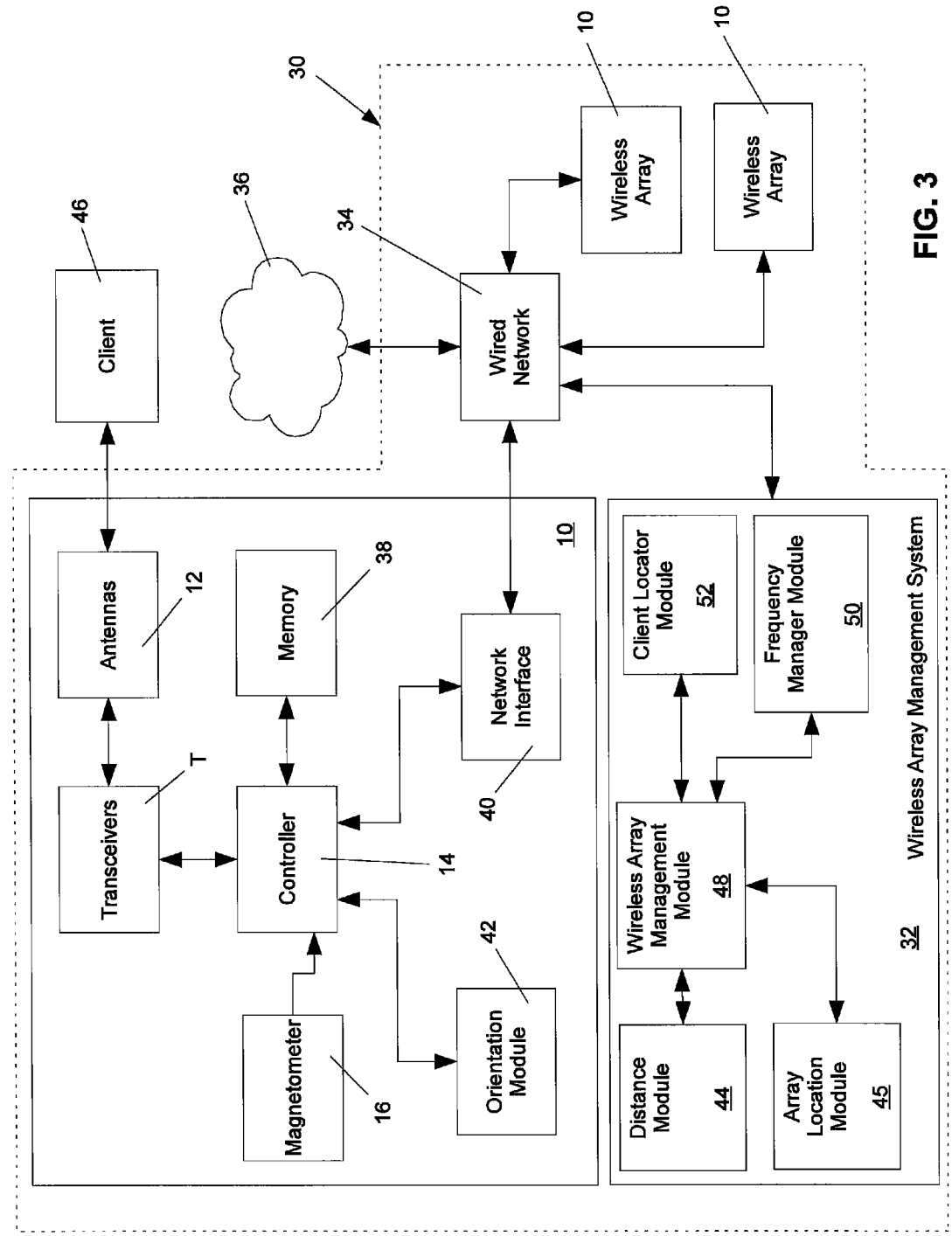
FIG. 3 is a representational view of an example of an implementation of a system for managing wireless arrays having magnetometers that are deployed in a network.

Referring now to FIG. 3, a representational view of a system 30 for managing wireless arrays 10 having magnetometers 16 that are deployed on a network. As seen in FIG. 3, the system 30 includes multiple wireless arrays 10 in signal communication with a wireless array management system 32. The wireless arrays 10 may be in signal communication with the wireless array management system 32 via a wired network 34, which may provide a connection to another network 36 such as, for example, the Internet. The wireless array management system may include various modules for monitoring, configuring, and managing the wireless arrays 10 deployed in the network.

The wireless array 10 seen in FIG. 3 includes components not shown in FIG. 1. In addition to the antennas 12, transceivers T, controller 14, and magnetometer 16, the wireless array 10 in the example shown includes a memory 38 and a network interface 40. Note that the transceivers T and antennas 12 of the wireless array are respectively shown collectively as a single block in FIG. 2. The wireless array 10 also includes an orientation module 42 for determining the geospatial orientation of the transceivers T based on the azimuth θ of the wireless array 10 as explained further below.

The memory 38 of the wireless array 10 may be in signal communication with the controller 14 and used to store information relating to the configuration and operation of the wireless array. The memory 14 of the wireless array 10 may be any form of data storage mechanism accessible by the controller 14 or any combination of such forms, such as, a magnetic media, an optical disk, a random access memory (RAM), a flash memory, or an electrically erasable programmable read-only memory (EEPROM). Additional or alternative forms of memory may be selectively employed.

The network interface 40 may also be in signal communication with the controller 14 and includes one or more wired network uplinks for exchanging communications between the wireless array 10 and a data network such as the wired network 34. For example, the network interface 40 may transmit the orientation information provided by the magnetometer 16 to the wired network 34 for receipt by the wireless array management system 32. The wired network uplinks of the network interface 40 may include, for example, a Gigabit Ethernet interface and a Fast Ethernet interface. Additional or alternative wired network uplinks and network interfaces may be selectively employed.

The magnetometer 16 can determine the spatial orientation of the wireless array 10, as discussed above, and is in signal communication with the controller 14. The controller 14 may read the orientation information from the magnetometer and store the orientation information in the memory 38 of the wireless array 10. The orientation information may be stored as an azimuth θ value. In some embodiments, the azimuth value θ may be stored in the memory 38 of the wireless array 10 as the angular orientation of transceiver T1 (FIG. 2) relative to the reference bearing 28 (FIG. 2). The orientation information may be read from the magnetometer 16 and stored, for example, when the wireless array is powered on and boots up. Alternatively, the orientation information may be read from the magnetometer 16 and stored at a periodic interval or in response to a command received at the wireless array 10 from the wireless array management system 32. As a result, accurate orientation information may be available when needed.

As mentioned above, the wireless array 10 may also include an orientation module 42 for determining the geospatial orientation of the transceivers T of the wireless array based on the azimuth θ of the wireless array. The orientation module 42 may selectively be an integrated circuit, a software module accessed by the controller 14. The orientation module 42 may be programmed with the positions of the transceivers T in the wireless array (e.g., at 45° intervals around the wireless array) or retrieve the positions from the memory 38 of the wireless array 10. Thus, the orientation module 42 may calculate the geospatial orientation of the transceivers T by adding the azimuth θ to the position of the transceivers T in the wireless array 10. The wireless array 10 may subsequently transmit the geospatial orientation of the transceivers T to the wireless array management system 32 for further processing.

The orientation module 42 in the example shown is illustrated as a component of the wireless array 10. Alternatively, the orientation module 42 may be a component of the wireless array management system 32. For example, the wireless array 10 may transmit to the wireless array management system 32 the azimuth θ of the wireless array and the position of the transceivers T in the wireless array. The calculation of the geospatial orientation of the transceivers T of the wireless array 10 may thus occur at the wireless array management system 32 rather than the wireless array itself. Alternative configurations or implementations of the orientation module 42 may selectively be employed.

The wireless array management system 32 may be implemented as one or more remote computing devices, which may be used to manage the wireless arrays 10, update the configurations of the wireless arrays, gather statistical information, locate and track clients in signal communication with one or more wireless arrays deployed in the network, and detect and locate rogue devices in signal communication with one or more of the wireless arrays. The computing devices host various modules used to monitor, configure, and manage the wireless arrays deployed in the network. The wireless array management system 32 in the example shown includes a distance module 44 for locating a client 46 in signal communication with a wireless array, an array location module 45 for positioning wireless arrays on a map, a wireless array management module 48, a frequency management module 50, and a client location module 52. The modules 44-45 and 48-52 may be implemented as software applications for carrying out the functions associated with monitoring, configuring, and managing the wireless arrays deployed in the network. Those skilled in the art will recognize that various implementations for the wireless array management system as well as additional or alternative modules may be selectively employed.

The distance module 44 for determining the distance between the wireless array and a client 46 may communicate with the wireless array management module 48 as shown in FIG. 3 when determining the distance to the client. The distance module 44 may determine the distance between the wireless array 10 and the client 46 based on the strength of a signal received at the wireless array from the client. The signal strength may be, for example, received signal-strength indication (RSSI) information.

Those skilled in the art will understand that RSSI information refers to the strength of a received signal, which may be determined by examining, for example, the power of the received signal. In the context of wireless devices and wireless access devices, an RSSI value may be correlated to the distance between a wireless device (e.g., a laptop) and a wireless access device (e.g., a wireless array). A high RSSI value may indicate a strong signal and thus a short distance between the wireless device and the wireless access device. Correspondingly, a low RSSI value may indicate a weak signal and thus a large distance between the wireless device and the wireless access device. The distance module 44 of the wireless array management system 32 may calculate the distance between the wireless array and the client 46 using the RSSI information. The wireless array 10 may transmit the RSSI information to the wireless array management system 32 for further processing when determining the distance from the wireless array to the client 46. Alternative configurations and implementations of the distance module may selectively be employed.

The wireless array management module 48 may be used, for example, to configure and monitor the status of the wireless arrays 10 deployed in the network; issue commands to the wireless arrays; monitor the clients 46 in signal communication with the wireless arrays; monitor the communications exchanged between the clients and the wireless arrays; compile statistics, traffic patterns, and data flow patters; generate reports and alerts; and perform upgrades to the software and policies of the wireless arrays deployed in the network.

The wireless array management module 48 may communicate with the array location module 45 to arrange and monitor the position of the wireless arrays deployed in the network. For example, the array location module 45 may enable a user to place the arrays 10 on a coordinate map, which will keep track the location of the arrays 10 on the map. Further, the antenna patterns of the arrays may be displayed on the map. The antenna patterns of an individual array may each be displayed in a different color. The color of the antenna patterns may also be used, for example, to indicate conflicts where overlapping antenna patterns broadcast at the same frequency. As discussed further below, the presentation of the wireless arrays and antenna patterns on a map enables a user to make informed decisions when configuring and monitoring the wireless arrays deployed in the network.

The wireless array management module 48 may also communicate with the frequency management module 50 and the client location module 52 to assist in carrying out the functions associated with those modules, which are described further below.

The frequency management module 50 may be used to configure the operating frequencies of the transceivers T of the wireless arrays 10 deployed in the network. The operating frequencies may be defined by, for example, the various channels available in the WiFi frequency bands as mentioned above. For example, under the IEEE 802.11b/g standard, channels 1, 6, and 11 define operating frequencies of 2412 MHz, 2437 MHz, and 2462 MHz respectively. When multiple wireless arrays 10 are deployed in a network, the wireless arrays may be installed and positioned physically proximate to one another such that frequency overlap may occur. As used in this application, positioned physically proximate refers to two or more wireless arrays are close enough to one another such that at least one antenna pattern of a wireless array overlaps at least one antenna pattern of another wireless array. Additionally, frequency overlap, as used in this application, results when a transceiver from one wireless array operates at the same frequency as a transceiver from another wireless array and the antenna patterns from each of the transceivers overlap. As discussed above, frequency overlap may result in interference and performance degradation. To avoid frequency overlap, wireless arrays 10 positioned proximate to one another may be configured using the frequency management module 50 such that transceivers having overlapping antenna patterns operate at different frequencies (i.e., in different channels).

The frequency management module 50 enables an operator to manage the operating frequencies of the transceivers T in the wireless arrays 10 deployed in the network such that frequency overlap may be avoided. The frequency management module 50 may display the location of the wireless arrays deployed in the network and the operating frequencies of the respective transceivers T in the wireless arrays 10. Thus, the frequency management module 50 allows an operator to identify transceivers having overlapping antenna patterns and the operating frequencies of those transceivers.

An operator may use the frequency management module 50 to reconfigure the operating frequencies of one or more of the transceivers T to avoid frequency overlap. For example, the wireless array management system 32 may issue a command to an appropriate wireless array 10 instructing the wireless array controller 14 to set a particular operating frequency for an appropriate transceiver T. In response to commands received from the wireless array management system 32, the controllers 14 of the wireless arrays 10 may set the transceivers T to operate at the desired frequencies. Frequency and channel settings are stored in each wireless array 10. Frequency configuration may be performed when the wireless arrays 10 are first installed and set up in the network. Additionally, frequency configuration may be performed when new RF interference occurs, for example, when a new wireless array is installed in an existing network.

The wireless array management system 32 may also include a client location module 52 that allows the wireless array management system 32 to determine the location of a client 46 in signal communication with a wireless array 10 deployed in the network (i.e., station localization). A client 46 may be identified, for example, by the name of the computing device (e.g., "ChemLabComp1") and/or the MAC address of the computing device (e.g., 03:27:33:74:a0:5c). Based on the particular wireless array 10 a client 46 is in signal communication with, the client location module 52 may determine that the client is in the vicinity of the location at which the wireless array is installed. Further, a client 46 may transmit communication signals to a particular transceiver T of the wireless array 10 and heard by the monitor radio of the wireless array 10. Based on the particular transceiver T the client 46 is in signal communication with, the client location module 52 may determine the location of the client 46 relative to the wireless array 10 (i.e., the geospatial location of the client). Further, the strength of the signals received at the monitor radio and the transceivers (i.e., RSSI), the distance between the client and the wireless array may be approximated.

For example, consider three wireless arrays respectively installed on the first, second, and third floors of a three story building. Each wireless array in this example may include four transceivers: a "north," "south," "east," and "west" transceiver. A client may transmit signals to the "north" transceiver of the second-floor wireless array; these signals may also heard by the monitor radio. The client location module 52 may first identify the wireless array and transceiver that the client is in signal communication with based on the transmissions from the client to the wireless array. In this case, the client location module 52 may determine that the client is located on the second floor of the building and is transmitting to the "north" transceiver. Further, based on the transmissions to the "north" transceiver, the client location module 52 may also determine that the client is located at the north end of the building northward of the second wireless array.

However, the accuracy of this positional information may depend on the geospatial orientation of the second-floor wireless array. If the second-floor wireless array is installed with the "north" transceiver facing in the southward direction, the client location module 52 may incorrectly determine the client is located northward of the wireless array instead of correctly determining the client is located southward of the wireless array. Thus, the accuracy of the geospatial location of the client may be improved by using the magnetometer to provide the geospatial orientation of the wireless array itself.

The magnetometer of the wireless array enhances the accuracy of the positional information by providing the client location module 52 with the geospatial orientation of the wireless array. Accordingly, the client location module 52 may accurately determine the location of a client by determining the geospatial orientation of the wireless array, the geospatial orientation of the transceiver nearest the client, and the distance between the client and the wireless array. Using the geospatial orientations of the wireless array, nearest transceiver, and RSSI value, the client locator module 52 may calculate a geospatial direction of the client relative to the wireless array. Those skilled in the art will recognize that this approach may be used to locate clients connected to the wireless array as well as clients simply in signal communication with the wireless array.

Further, the client locator module 52 may identify a geospatial sector (76 and 78 in FIG. 5) in which the client is located based on the geospatial orientation of the nearest transceiver and the RSSI value. The geospatial sector (76 and 78 in FIG. 5) may be, for example, the coverage area defined by the antenna pattern of the wireless array the client is in signal communication with. Further, the size and shape of the geospatial sector may be defined by, for example, the size and shape of the antenna pattern of the transceiver.

In the example above, the client location module 52 may determine from the azimuth information provided by the magnetometer that the second-floor wireless array is oriented in a southward direction. Accordingly, the client location module 52 may determine that the "north" transceiver is also oriented in a southward direction. Thus, the client location module 52 may correctly determine that while the client is nearest to the "north" transceiver, the client is located in a geospatial sector southward of the wireless array on the second floor with the size and shape of the geospatial sector defined by the antenna pattern of the "north" transceiver.

As mentioned above, the wireless array management system 32 may include a distance module 44 for determining the distance between a wireless array and a client 46. The client location module 52 may use the distance between the wireless array 10 and the client 46 in conjunction with the angular direction of the client relative to a wireless array to further define the geospatial sector in which the client is located. The client location module 52 may additionally or alternatively use the distance between the wireless array 10 and the client 46 in conjunction with the geospatial orientation of the transceiver T in the wireless array that indicates the strongest signal from the client.

Those skilled in the art will recognize that antenna patterns for some transceivers may be relatively large resulting in a large coverage area and thus a large geospatial sector in which the client is located. Thus, the client location module 52 may use the combination of the distance between the wireless array 10 and the client 46 and the geospatial orientation of the transceiver T the client is nearest in order to identify a more focused geospatial sector in which the client is located. The geospatial sector identified by combining the distance with the geospatial orientation of a transceiver T may be smaller than a geospatial sector identified by the geospatial orientation of a transceiver alone.

Figure 4A:
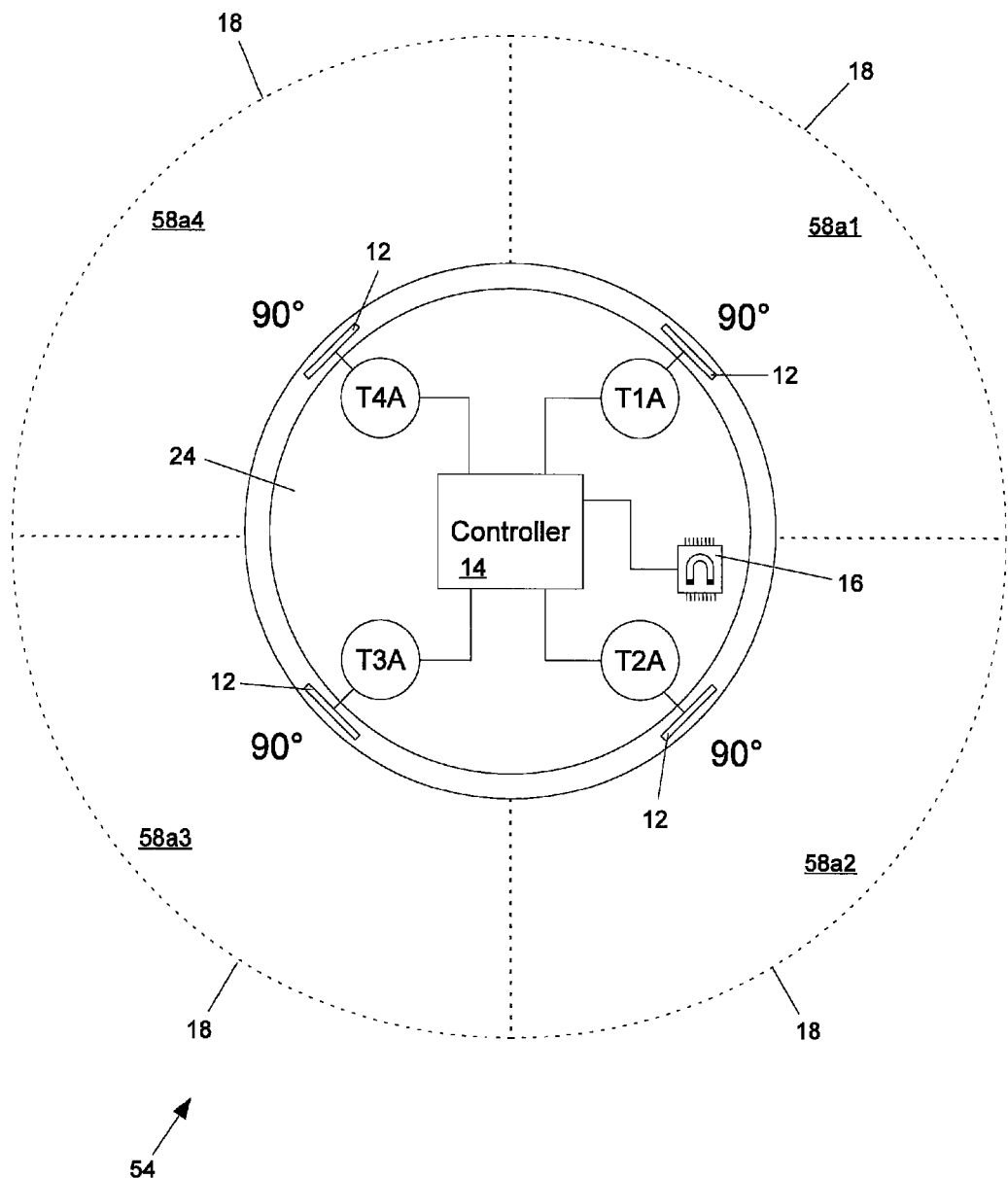
FIG. 4A is a schematic view of an example of an implementation of a wireless access device that provides orientation information having four transceivers.
Figure 4B:
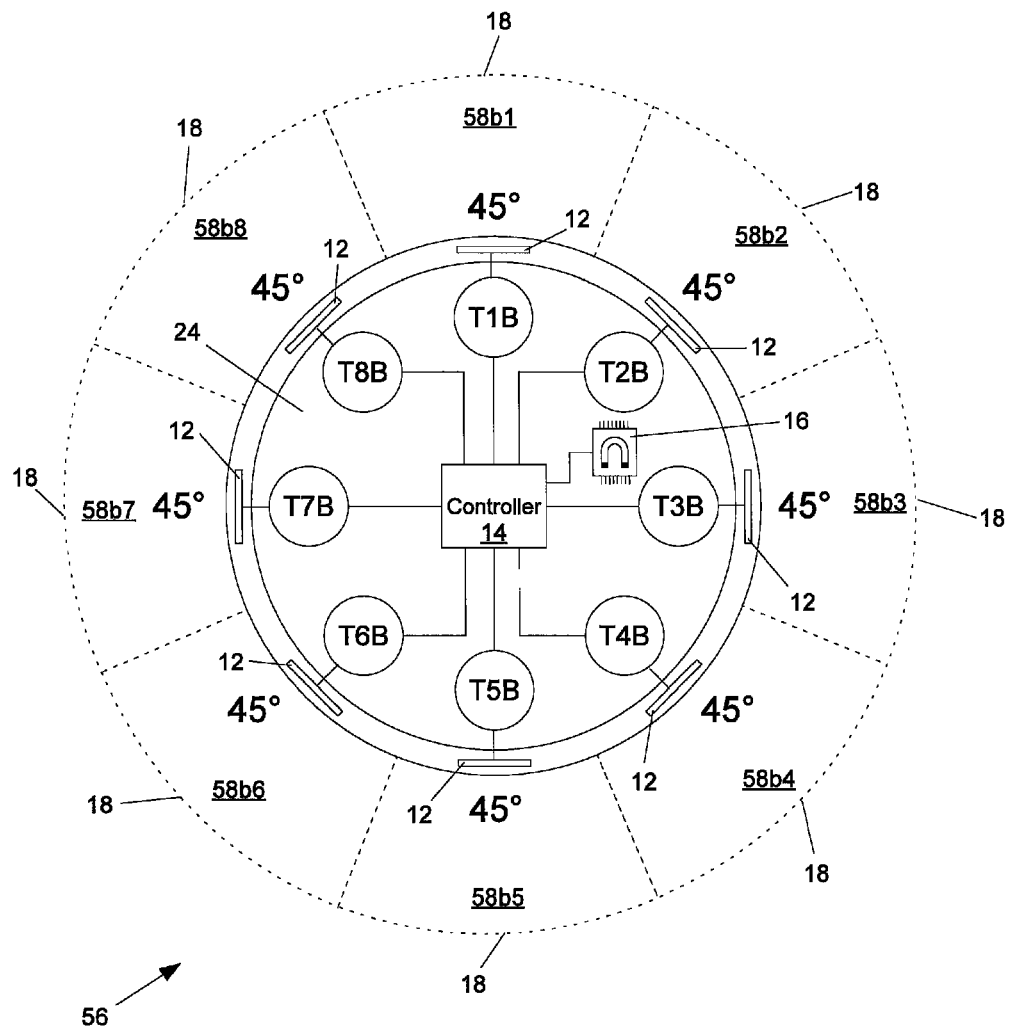
FIG. 4B is a schematic view of an example of an implementation of a wireless access device that provides orientation information having eight transceivers.

With reference now to FIG. 4A and FIG. 4B, two example wireless arrays 54 and 56 are shown respectively. The wireless array 54 of FIG. 4A includes four transceivers T1A-T4A, and the wireless array 56 of FIG. 4B includes eight transceivers T1B-T8B. As discussed above with reference to FIG. 1, the antenna pattern of each transceiver T1A-T4A and T1B-T8B defines a sector coverage patterns 58a-b ("sectors"). As seen in FIGS. 4A-B, the size of each sector 58a-b depends on the number of transceivers in the wireless array 54 and 56. For clarity, the overlapping portions 22 (FIG. 1) between adjacent antenna patterns 18 have been omitted in FIG. 4A and FIG. 4B. Additionally, the transceivers may broadcast a respective back-lobe antenna radiation pattern, which are also not included in FIG. 4A and FIG. 4B. As the number of transceivers in the wireless array increases, the size of the sector decreases. The wireless array 54 in FIG. 4A having four transceivers T1A-T4A is divided into four sectors 58a1-4 in which a client in signal communication with the wireless array may be located. Each sector 58a in the example shown is 90° (one-fourth of 360°). Therefore, a client transmitting to transceiver T2A would be located in the bottom-right 90° sector 58a2. The wireless array 56 in FIG. 4B having eight transceivers T1B-T8B includes eight 45° sectors 58b1-8 (one-eighth of 360°). Because the sectors 58b are smaller in FIG. 4B relative to the sectors 58a in FIG. 4A, the area in which a client may be located is smaller. For example, a client transmitting to transceiver T3B would be located in the 45° sector 58b3 to the right of the wireless array 56.

Those skilled in the art will recognize that the sectors may be further narrowed in wireless arrays having even more transceivers. As mentioned above, wireless arrays may include, for example, 12 and 16 transceivers. A wireless array having 12 transceivers would thus provide twelve 30° sectors, and a wireless array having 16 transceivers would thus provide sixteen 22.5° sectors. As a result, the potential for accurately determining the geospatial location of a client in signal communication with a network is enhanced when accurate information regarding the geospatial orientation of the wireless array is available.

Figure 5:
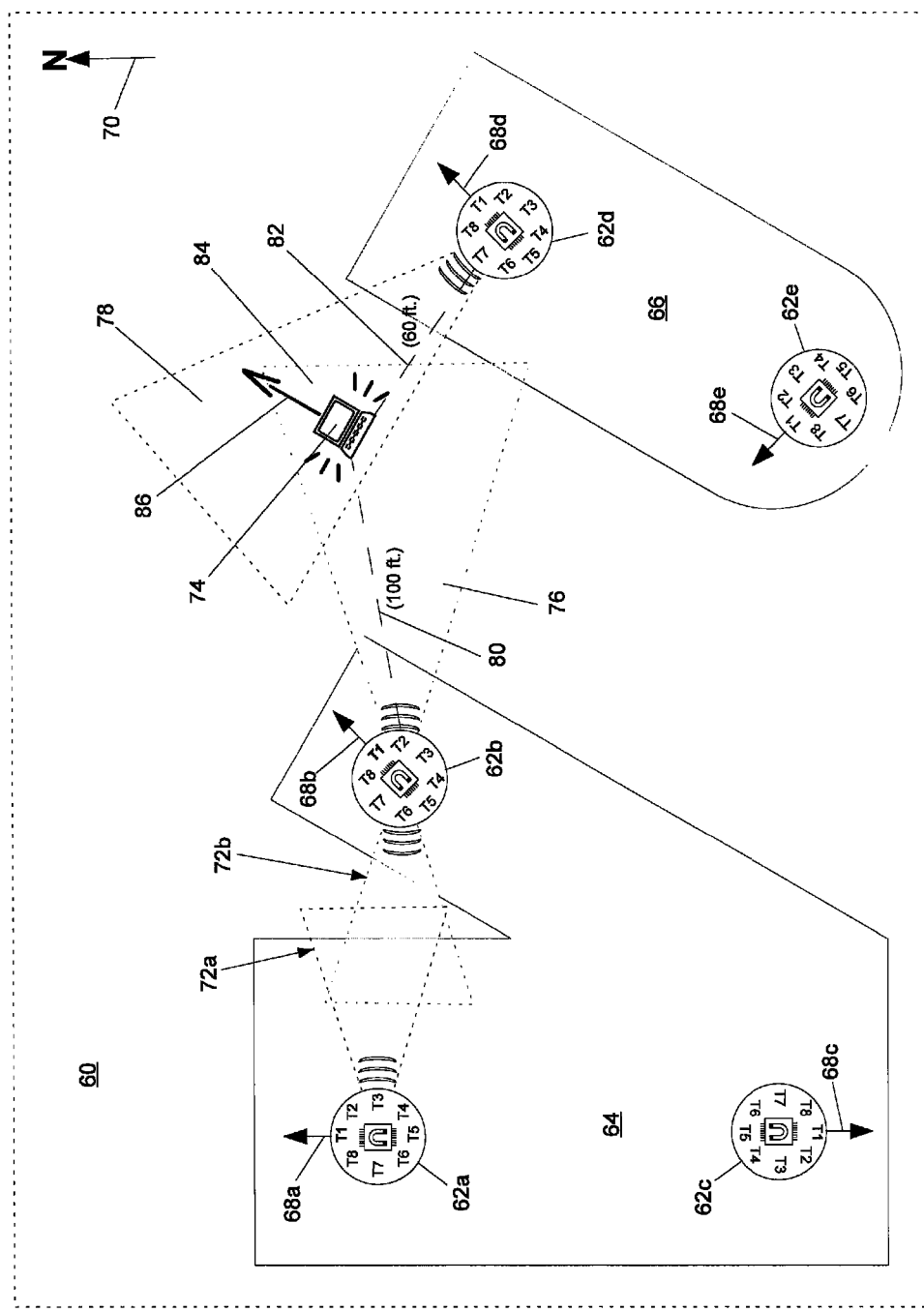
FIG. 5 is a top view of a campus having multiple wireless access devices that provide orientation information installed at various locations throughout the campus.

Turning now to FIG. 5, a campus 60 having multiple wireless arrays 62a-e installed at various locations throughout the campus is shown. Three wireless arrays 62a-c are installed in the first building 64, and two wireless arrays 62d-e are installed in the second building 66. As seen in FIG. 5, the wireless arrays 62a-e installed throughout the campus are not oriented in the same direction. As indicated by their respective bearings 68a-e, wireless array 62a is oriented 0° CW from magnetic north 70; wireless arrays 62b and 62d 45° CW from magnetic north; wireless array 62c 180° CW from magnetic north; and wireless array 62e 315° CW from magnetic north. Therefore, having knowledge of the geospatial orientation of the wireless arrays 62a-e may be useful when configuring the wireless arrays to avoid frequency overlap and when determining the location of a client wirelessly in signal communication with a wireless array.

As seen in FIG. 5, two wireless arrays 62a and 62b are installed near the north end of the first building 64. Wireless array 62a is installed 0° from magnetic north and wireless array 62b is installed 45° CW from magnetic north. As a result, transceiver T3 in the wireless array 62a faces transceiver T6 of wireless array 62b. As shown in FIG. 5, the antenna pattern 72a of transceiver T3 in wireless array wireless array 62a overlaps with the antenna pattern 72b of transceiver T6 in wireless array 62b. If transceiver T3 and transceiver T6 broadcast at the same frequency (e.g., 2437 MHz), frequency overlap may result causing interference and performance degradation as described above.

The wireless array management system 32 (FIG. 3) may be used to configure the frequencies of the wireless arrays 62a-b in order to avoid frequency overlap. The respective magnetometers 16 (FIGS. 1-3) in each wireless array 62a-b may be used to determine the geospatial orientation of the wireless arrays, in this case 0° and 45° CW from magnetic north 70 respectively. The geospatial orientation information may then be transmitted to the wireless array management system 32, which may then determine the geospatial orientation of the transceivers T1-T8 in the wireless arrays 62a-b. In the example shown, the wireless array management system 32 may determine that transceiver T3 in wireless array 62a has a geospatial orientation of 90° CW from north (i.e., in a eastward direction), and that transceiver T6 in wireless array 62b has a geospatial orientation of 270° CW from north (i.e., in a westward direction). Accordingly, the wireless array management system 32 may determine that the antenna pattern 72a from transceiver T3 in wireless array 62a overlaps the antenna pattern 72b from transceiver T6 in wireless array 62b. In response to this determination, the wireless array management system 32 may configure transceiver T3 in wireless array 62a and transceiver T6 in wireless array 62b to operate on different frequencies. For example, the wireless array management system 32 may transmit commands to the wireless arrays 62a-b instructing the respective controllers to set the operating frequencies of transceiver T3 and transceiver T6 to 2412 MHz and 2437 MHz respectively. As a result, the wireless arrays 62a-b may avoid the interference and performance degradation issues caused by the overlapping antenna patterns 72a-b.

The frequency settings may be entered manually by the network operator. Additionally or alternatively, the frequency manager module 50 may select a desired frequency for each transceiver T based on the orientation of the other arrays 10 in the system 30. Based on the location of the arrays 10 relative to one another, the frequency manager module 50 may select frequencies for each array 10 that avoids or mitigates frequency overlap. Furthermore, the frequency manager module 50 may use RSSI information obtained from the transceivers T and information obtained from the array location module 45 to make additional decisions regarding the frequencies to use for each array 10.

As mentioned above, the wireless arrays 10 may be positioned on a coordinate map using the array location module 45, and the array location module may display color-coded antenna patterns of the wireless arrays. This color-coded presentation of the wireless array antenna patterns and conflicts improves the ability to determine, for example, a desired frequency mapping during manual configuration of the wireless arrays.

Still referring to FIG. 5, the client location module 52 (FIG. 3) of the wireless array management system 32 may determine the geospatial location of a client 74 within range of the wireless array where the azimuth θ (FIG. 2) of a wireless array is known. As seen in FIG. 5, a client 74 is located on the campus between the first building 64 and the second building 66. The transmissions of client 74 are heard by the monitor radio (T1) of wireless array 62b in the first building 64 and by the monitor radio (T1) of wireless array 62d in the second building 66. In the example shown, the client 74 is also determined to be closest to transceiver T2 of wireless array 62b and is closest to transceiver T7 of wireless array 62d. As shown in FIG. 5, both the wireless arrays 62b and 62d are oriented 45° CW from magnetic north.

The magnetometers 16 of each wireless array 62b and 62d may determine the geospatial orientation of each wireless array, which the client location module 52 may use to determine the geospatial orientation of transceiver T2 in wireless array 62b and the geospatial orientation of transceiver T7 in wireless array 62d. Since each wireless array 62b and 62d includes eight transceivers T1-T8, transceiver T2 is positioned 45° CW from the top of the wireless arrays and transceiver T7 is positioned 270° CW from the top of the wireless arrays. Thus, the orientation module 42 (FIG. 3) may calculate the orientation of the transceivers T1-T8 by adding the azimuth θ (45° CW) to the position of the transceivers T2 and T7 respectively. Adding the azimuth θ to the position of the transceivers T2 and T7 in the example shown results in a geospatial orientation of 90° CW for transceiver T2 in wireless array 62b and a geospatial orientation of 315° CW for transceiver T7 in wireless array 62d.

Using the geospatial orientation of each transceiver T2 and T7, the client location module 52 may determine the geospatial sectors 76 and 78 in which the client 74 is located. The geospatial sector 76 for wireless array 62b in the example shown is the 45° sector east of the wireless array. The geospatial sector 78 for wireless array 62d in FIG. 5 is the 45° sector northwest of the wireless array. Additionally, the client location module 52 may use RSSI information to determine the respective distances 80 and 82 between the client 74 and the wireless arrays 62b and 62d. For example, in FIG. 5, distance 80 illustrates that the client 74 is one-hundred feet from wireless array 62b and distance 82 illustrates that the client is sixty feet from the wireless array 62d. Thus, the client location module 52 may determine that the client 74 is located one-hundred feet east of the wireless array 62b and sixty feet northwest of wireless array 62d. This positional information may be compared against a map of the campus to display the location of the client 74 on a map of the campus 60. This same method of determining location of a client may be applied to determining the location of a rogue device (e.g., a rogue client or a rogue access point) or other source of interference.

FIG. 5 also illustrates that using multiple arrays 62b and 62d to locate a client 74 (i.e., triangulation) can enhance the accuracy of determining the geospatial location of the client. Using one wireless array may allow the client location module 52 to determine a particular geospatial sector a client is located in, for example, a 45° geospatial sector 76 east of wireless array 62b. However, as the client 74 moves farther away from a wireless array, the total area of the geospatial sector increases, which may make it more difficult to locate the client 74 in a relatively large area. Using multiple wireless arrays to locate the client 74 may reduce the size of the geospatial sector the client is located in due to overlapping geospatial sectors 76 and 78 as shown in FIG. 5. The portion 84 of the geospatial sectors that overlap indicates the client 74 is transmitting from a location in the overlapping portion, thus limiting the possible geospatial locations of the client to a relatively smaller area.

As shown in FIG. 5, the 45° geospatial sectors 76 and 78 from each of the wireless arrays 62b and 62d are relatively large compared to the portion 84 of the geospatial sectors that overlap. The client location module 52 may thus limit the possible geospatial locations of the client to a geospatial area defined by the portion 84 of each geospatial sector that overlap. As can be seen from FIG. 5, using two wireless arrays 62a and 62d may allow the client location module 52 to limit the scope of the search area to a relatively smaller area than a search area identified by only one wireless array. Those skilled in the art will recognize that the scope of the search area may be further narrowed by using more than two wireless arrays.

FIG. 5 further illustrates that the client location module 52 may be used to track a client 74 as the client moves, for example, through the campus 60. By repeatedly determining (at least twice) the geospatial direction of the client 74 relative to at least one of wireless array 62a and wireless array 62d and repeatedly determining (at least twice) the distance between at least one of the wireless arrays and the client, the client location module 52 may determine a direction of movement 86 of the client 74. The direction of movement 86 of the client 74 may also be referred to as the bearing of the client. Repeatedly determining the geospatial position of the client 74 to determine a direction of movement may be useful where the client is not stationary.

As seen in FIG. 5, the client 74 has a northeast bearing 86. The client location module 52 may repeatedly monitor the RSSI information of the client 74 to determine that the client shown in FIG. 5 is moving farther away from the two wireless arrays 62*b* and 62*d*. Additionally, the client location module 52 may monitor the different transceivers and wireless arrays the client 74 transmits to as the client moves through the campus 60. For example, as the client 74 in FIG. 5 moves in the northeast direction, the client may successively appear closer to different transceivers T1-T8 of the wireless arrays 62*a* and 62*d*. The client 74 may move far enough northeast, for example, that the client ceases to be heard by transceiver T7 in wireless array 62*d* and still be heard by transceiver T8 in the wireless array. As a result, the client location module 52 may detect a change in the angular direction of the client 74 relative to the wireless array 62*d* and identify multiple geospatial sectors in which the client is successively located. Thus, continuous monitoring of the angular direction of a client relative to one or more wireless arrays allows the client location module 52 to determine a bearing of the client. The bearing of a client may be used in conjunction with continuous RSSI information received from the client to track the client in real-time as the client moves across a campus or through a building. Real-time tracking may be useful, for example, for prompt recovery of a stolen wireless device. To further assist in locating a client, the geospatial sectors in which the client is located and the bearing of the client may be displayed on a map.

Figure 6:
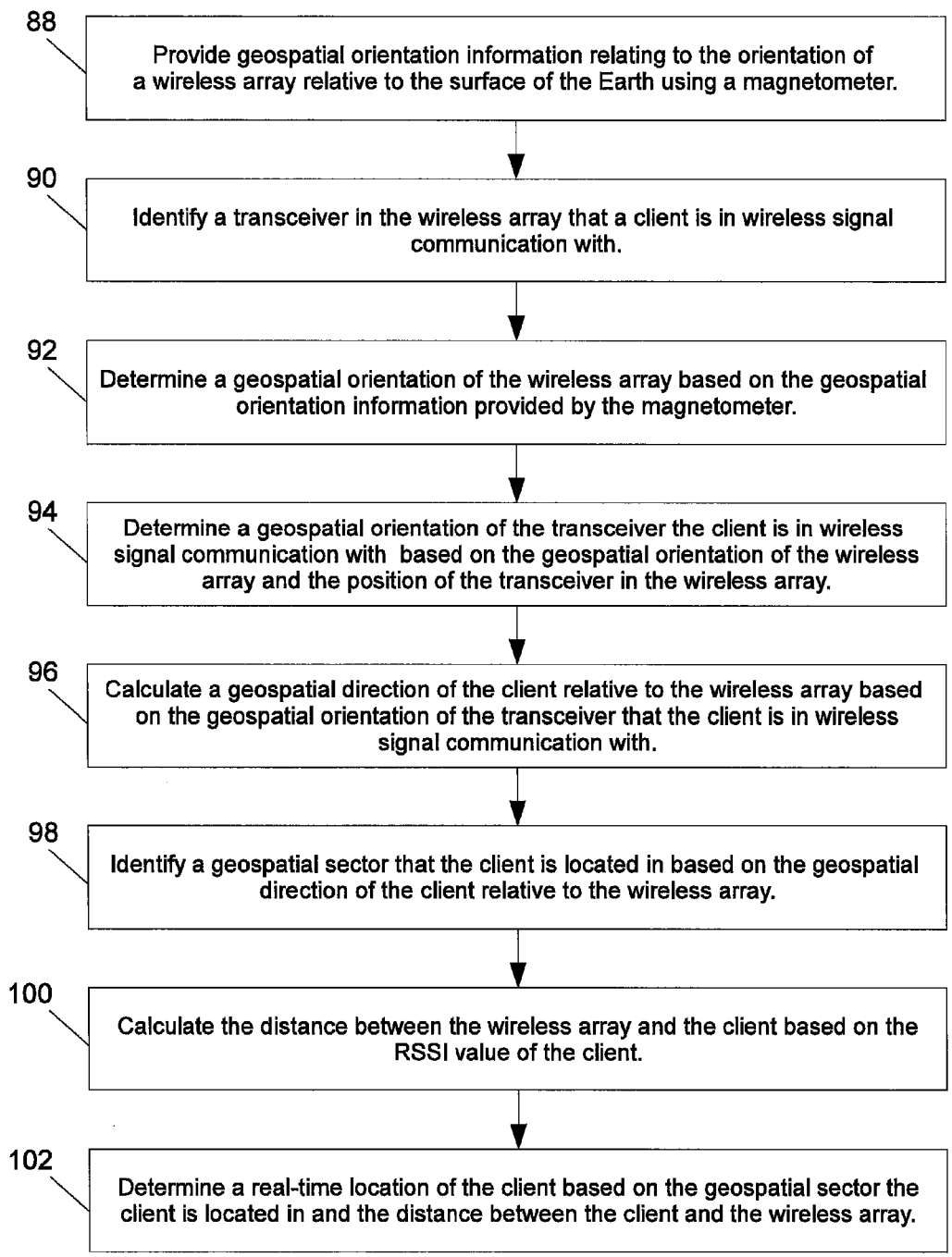
FIG. 6 is a flowchart of an example of an implementation of a method for determining a geospatial location of a client in signal communication with a wireless array relative to the wireless array.

Referring now to FIG. 6, a flowchart of an example of an implementation of a method for determining a geospatial location of a client in signal communication with a wireless array relative to the wireless array is shown. A magnetometer provides geospatial orientation information relating to the orientation of a wireless array relative to the surface of the Earth (step 88). A transceiver in the wireless array that a client is in signal communication with is identified (step 90). The geospatial orientation of the wireless array is determined based on the geospatial orientation information provided by the magnetometer (step 92). The geospatial orientation of the transceiver the client is in signal communication with is determined based on the geospatial orientation of the wireless array and the position of the transceiver in the wireless array (step 94). The geospatial direction of the client relative to the wireless array is calculated based on the geospatial orientation of the transceiver that the client is in signal communication with (step 96). A geospatial sector that the client is located in is identified based on the geospatial direction of the client relative to the wireless array (step 98). Additionally, the distance to the client from the wireless array is calculated based on, for example, the RSSI value of the client (step 100). The geospatial sector in which the client is located and the distance to the client from the wireless array may then be used to identify in real-time the location of the client relative to the wireless array (step 102). Those skilled in the art will recognize that some of the steps for the method described above may selectively be executed concurrently or in a different sequence.

The invention illustratively disclosed suitably may be practiced in the absence of any element, part, step, component, or ingredient which is not specifically disclosed in this application.

While in the foregoing detailed description this invention has been described in relation to certain preferred embodiments thereof, and many details have been set forth for purposes of illustration, it will be apparent to those skilled in the art that the invention is susceptible to additional embodiments and that a certain of the details described herein can be varied considerably without departing from the basic principles of the invention.

What is claimed is:

1. A wireless array for providing wireless access to a network comprising:
   a plurality of transceivers in signal communication with a corresponding plurality of antennas disposed to form a circular array of antennas, each antenna configured to radiate a directional antenna pattern covering a portion of the circular area surrounding the circular array, each transceiver configured to communicate with a client in the portion of the circular area covered by the antenna corresponding to the transceiver;
   a magnetometer that provides orientation information relating to an orientation of the wireless array relative to a magnetic field; and
   a controller in signal communication with the plurality of transceivers and in signal communication with the magnetometer, the controller manages the communications exchanged via the transceivers and receives the orientation information provided by the magnetometer.

2. The wireless array of claim 1 wherein the magnetometer provides the orientation information as geospatial orientation information relating to the orientation of the wireless array relative to the surface of the Earth.

3. The wireless array of claim 2 wherein the orientation information provided by the magnetometer comprises an azimuth, the azimuth comprising an angular measurement between a bearing of the wireless array and a reference bearing.

4. The wireless array of claim 3 wherein the reference bearing is magnetic north.

5. The wireless array of claim 3 further comprising an orientation module in signal communication with the controller, the orientation module determines a respective geospatial orientation of at least one transceiver in the plurality of transceivers based on the orientation information provided by the magnetometer and respective position of the at least one transceiver in the wireless array.

6. The wireless array of claim 5 wherein the orientation module determines the respective geospatial orientation of the at least one transceiver based on the azimuth and the respective position of the at least one transceiver in the wireless array.

7. The wireless array of claim 6 wherein the orientation module calculates the respective geospatial orientation of the at least one transceiver by adding the azimuth to the respective position of the at least one transceiver in the wireless array.

8. The wireless array of claim 5 further comprising a distance module in signal communication with the controller, the distance module determines a distance between the wireless array and a client in signal communication with the wireless array such that a combination of the distance determined by the distance module and the respective geospatial orientation of the at least one transceiver provided by the orientation module identifies a geospatial sector in which the client is located.

9. The wireless array of claim 8 wherein the geospatial sector is defined by an antenna pattern of a transceiver in the plurality of transceivers of the wireless array that the client is in signal communication with.

10. The wireless array of claim 8 wherein the distance module determines the distance between the wireless array and the client in signal communication with the wireless array based on a signal strength of a signal received at the wireless array from the client.

11. The wireless array of claim 1 wherein the orientation information provided by the magnetometer is stored in the memory during a boot-up operation, at a periodic interval, or in response to a command received at the wireless array.

12. The wireless array of claim 1 further comprising a network interface in signal communication with the controller, the network interface transmits the orientation information provided by the magnetometer to a data network.

* * * * *